Sept. 30, 1969 P. SVEDBERG 3,470,036

RECTIFYING SEMI-CONDUCTOR BODY

Filed May 14, 1965

INVENTOR.
Per Svedberg
BY
Bailey, Stephens + Huettig
ATTORNEYS

United States Patent Office 3,470,036
Patented Sept. 30, 1969

3,470,036
RECTIFYING SEMI-CONDUCTOR BODY

Per Svedberg, Vallingby, Sweden, assignor to Allmänna Svenska Elektriska Aktiebolaget, Vasteras, Sweden, a corporation of Sweden
Filed May 14, 1965, Ser. No. 455,891
Claims priority, application Sweden, May 15, 1964, 5,947/64
Int. Cl. H01l *3/12*
U.S. Cl. 148—33.5 7 Claims

ABSTRACT OF THE DISCLOSURE

A thyristor having very high blocking and reverse voltages; it comprises a semi-conductor body of silicon having, parallel to each other, end zones of opposite conductivity type with an impurity concentration of $10^{18}$–$10^{20}$ impurity atoms/cm.$^3$ and a middle zone of lower impurity concentration forming P-N-junctions with the end zones; the middle zone is of at least three parallel layers, a central layer having a thickness of 100 to 1000 $\mu$m. and a product of impurity concentration to thickness of less than $10^{12}$ impurity atoms/cm.$^2$ and the outer layers each having a thickness of 1–20% of the thickness of the central layer and an impurity concentration to thickness product of $2.10^{11}$–$2.10^{12}$ impurity atoms/cm.$^2$; the middle zone also may have an additional layer having a thickness of 1–100 $\mu$m. and a product of impurity concentration and thickness of $10^{12}$–$10^{15}$ impurity atoms/cm.$^2$ between one of the outer layers and the P-N-junction.

Figure 1:
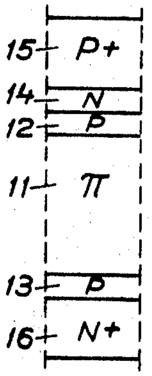

For a long time it has been desirable to produce thyristors with higher forward blocking and reversing voltages than those which can at present be reached with conventional thyristor manufacturing techniques. By forward blocking voltage is meant the maximum voltage the thyristor can take up without igniting (in forward direction) and by reverse blocking voltage the maximum voltage at the opposite polarity.

The semi-conductor body of a thyristor is built up of four zones, the N±, P—, N— and P+-zones. The two outer zones conduct well and in the forward direction of the thyristor they inject holes and electrons to the two inner high-ohmic centre zones. One of these is often more low-ohmic and thinner than the other. The part of the semi-conductor body which is situated between the well-conducting outer zones is in the following part of this application called the middle zone.

According to the present invention it has been found possible to realize improvement in the performance of thyristors so that thyristors with considerably higher forward blocking voltages and reverse blocking voltage can be manufactured.

The invention relates to a rectifying semi-conductor body with a middle zone with low conductivity and end zones of mutually opposite conductivity type, arranged on both sides of the middle zone and having high conductivity in relation to that of the middle zone and each forming a P-N junction with the middle zone. The rectifying semi-conductor body is characterised by the fact that the middle zone comprises a central layer with relatively large thickness and with low conductivity and an outer layer arranged on each side of the central layer with considerably smaller thickness and with higher conductivity than the central layer.

The outer layers can be of the same conductivity type in which case the middle zone comprises a layer of another conductivity type than that of the outer layers arranged outside the one outer layer.

The outer layers can also be of different conductivity type in which case these outer layers together with the central layer constitute the middle zone of the semi-conductor body.

Irrespective of the conductivity type of the outer layers, the central layer can be weak P- or weak N-conducting. If the outer layer are of the same conductivity type it is however preferred that the central layer is also of this conductivity type. The product of the impurity concentration and the thickness of the central layer suitably falls below the value $10^{12}$ atoms/cm.$^2$. The thickness lies preferably between approximately 100 and 1000 $\mu$m.

For the outer layers the product of the impurity concentration and the thickness can advantageously have a value of $2 \cdot 10^{11}$–$2 \cdot 10^{12}$ impurity atoms/cm.$^2$ and preferably $5 \cdot 10^{11}$–$10^{12}$ impurity atoms/cm.$^2$. The thickness of each outer layer is 1–20%, preferably 2–10% of the thickness at the central layer.

If the middle zone comprises a layer of another conductivity type than that of the outer layers arranged outside the one outer layer, this layer can have an impurity concentration and a thickness which is normal for the low-ohmic middle zone in a conventional thyristor, i.e. the product of the impurity concentration and the thickness is advantageously from $10^{12}$ to $10^{15}$ impurity atoms/cm.$^2$ and the thickness from 1–100 $\mu$m.

The impurity concentrations in the end zones have advantageously a value of $10^{18}$–$10^{20}$ atoms/cm.$^3$. That the zones are designated end zones does not mean that the semi-conductor body cannot have one or several more zones arranged outside one or both of the end zones, for example in order that the semi-conductor body may be able to serve as a symmetrical switch. In the exemplified case, one additional zone of opposite conductivity is arranged outside the one end zone.

Figure 2:
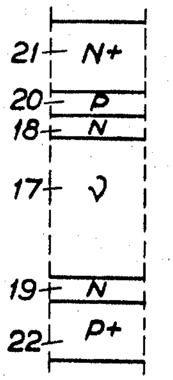
Figure 3:
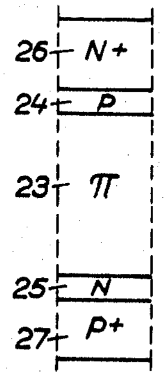
Figure 4:
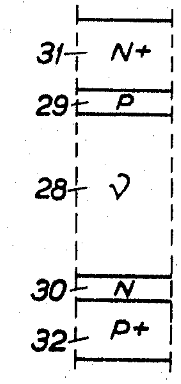

The invention will be explained in more detail by describing a number of embodiments with reference to the accompanying drawing, in which FIGS. 1 and 2 show schematically a section in the current direction of a rectifying semi-conductor body, whose middle zone comprises, besides the central layer and two outer layers of the same conductivity type, a layer of another conductivity type arranged outside the one outer layer, FIGS. 3 and 4 show schematically a section in the current direction of another rectifying semi-conductor body, in which the middle zone has two outer layers of different conductivity types and FIG. 5 finally a practical embodiment of a semi-conductor system with a semi-conductor body according to the invention.

The semi-conductor body exemplified in FIG. 1 has a middle zone which consists of a weakly P-doped central layer 11, of the two more highly P-doped outer layers 12 and 13 and of the N-doped layer 14 situated outside the P-doped outer layer 12. The highly P- and N-doped end zones are designated 15 and 16 respectively. The impurity concentration is $10^{13}$ impurity atoms/cm.$^3$ in layer 11, $2 \cdot 10^{15}$ impurity atoms/cm.$^3$ in layers 12 and 13, $10^{16}$–$10^{17}$ impurity atoms/cm.$^3$ in layer 14 and $10^{18}$–$10^{20}$ impurity atoms/cm.$^3$ in the end zones 15 and 16. For the layer 11 the thickness is 100 $\mu$m. and for the layers 12 and 13 it is 5 $\mu$m. The layer 14 has a thickness of, for example, 20 $\mu$m.

In the semi-conductor body exemplified in FIG. 2, the middle zone consists of a weakly N-doped central layer 17, of the two more highly N-doped outer layers 18 and 19 and of the P-doped layer 20 situated outside layer 18. 21 and 22 designate the highly N- and P-doped end zones respectively. The impurity concentration is $10^{12}$ impurity atoms/cm.$^3$ in layer 17, $2 \cdot 10^{14}$ impurity atoms/cm.$^3$ in the layers 18 and 19, $10^{16}$–$10^{17}$ impurity atoms/cm.$^3$ in layer 20, and $10^{18}$–$10^{20}$ impurity atoms/cm.$^3$ in the end zones 21 and 22. For the layer 17 the thickness is 1000 $\mu$m. and for the layers 18 and 19 it is 50 $\mu$m. The thickness for the layer 20 can, for example, be 30 $\mu$m.

The semi-conductor body illustrated in FIG. 3 has a middle zone which consists of a weakly P-doped central layer 23 and of the two more highly P and N-doped outer layers 24 and 25 respectively. The highly N and P-doped end zones are designated 26 and 27. The impurity concentration is $10^{13}$ impurity atoms/cm.$^3$ in layer 23, $2 \cdot 10^{15}$ impurity atoms/cm.$^3$ in the layers 24 and 25 and $10^{18}$–$10^{20}$ impurity atoms/cm.$^3$ in the end zones 26 and 27. For layers 23 the thickness is 100$\mu$ and for the layers 24 and 25 it is 5 $\mu$m.

At the semi-conductor body according to FIG. 4, the middle zone consists of the weakly N-doped central layer 28 and of the two more highly P and N-doped outer layers 29 and 30 respectively. 31 and 32 designate the highly N and P-doped end zones respectively. The impurity concentration is $10^{12}$ impurity atoms/cm.$^3$ in layer 28, $2 \cdot 10^{14}$ impurity atoms/cm.$^3$ in the layers 29 and 30, and $10^{18-20}$ impurity atoms/cm.$^3$ in the end zones 26 and 27. The layer 28 has a thickness of 1000 $\mu$m. and the layers 29 and 30 a thickness of 50 $\mu$m.

Figure 5:
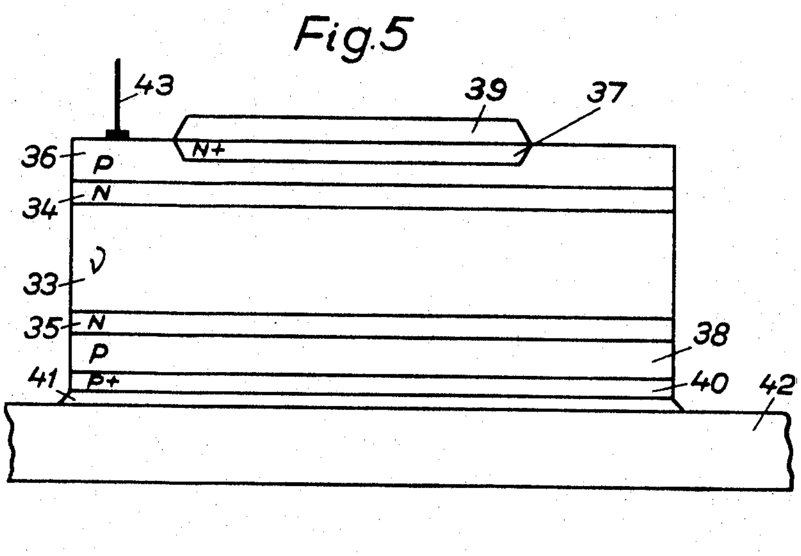

In the practical embodiment shown in FIG. 5, the middle zone consists of a weakly N-doped central layer 33, of the two more highly N-doped outer layers 34 and 35 and of the P-doped layer 36 situated outside the N-doped outer layer 34. The highly N- and P-doped end zones are designated 37 and 38–40 respectively. The highly N-doped end zone 37 has been effected by alloying a gold-antimony contact 39 to the surface of the semi-conductor and the highly P-doped end zone by alloying an aluminium foil 41 to the surface of the semi-conductor body. In connection with the alloying of the aluminium foil, the semi-conductor body has been fixed on a support plate 42 serving also as a contact, for example of molybdenum or another material with a coefficient of thermal expansion suited to that of the semi-conductor body. The impurity concentration is $4 \cdot 10^{12}$ impurity atoms/cm.$^3$ in layer 33, and $10^{15}$ impurity atoms/cm.$^3$ in layers 34 and 35. In the layer 36 the impurity concentration rises from $10^{15}$ impurity atoms at the border area adjacent to layer 34 to $10^{18}$ impurity atoms/cm.$^3$ at the border area adjacent to the end zone 37, where the impurity concentration is $10^{18}$ impurity atoms/cm.$^3$. In the same way the impurity concentration in the end zones 38–40 rises from $10^{15}$ impurity atoms/cm.$^3$ at the border area adjacent to the layer 35 to $10^{18}$ impurity atoms/cm.$^3$ at the border area adjacent to the aluminium layer 41. For the layer 33 the thickness is 200 $\mu$m. and for the layers 34 and 35 it is 10 $\mu$m. The end zone 37 has a thickness of 20 $\mu$m. and the layer 36 a thickness of 20 $\mu$m. in the area between the end zone 37 and the layer 34. The thickness of the end zone 38–40 is 40 $\mu$m. 43 designates a gate electrode.

The manufacture of a semi-conductor body according to FIG. 5 can be carried out by providing a wafer of silicon with an impurity concentration of $4 \cdot 10^{12}$ impurity atoms/cm.$^3$ by means of epithactical growth on both sides with N-doped layers, whose doping is the same as in the succeeding layers 34 and 35 and which has the same thickness as 34 and 36 together and 35, 38 and 40 together, respectively. The epithactical growth can be produced by heating the silicon layer to approximately 1200° C. in a mixture of silicon tetrachloride and hydrogen and traces of phosphorus trichloride or pentachloride, whereby a monocrystalline silicon layer grows out on both sides of the silicon layer at the same time as N-doping phosphorus is incorporated. When the epithactical growth is finished, the layer is provided with the P-doped layer 36 and 38 by gallium partly being diffused into the epithactically grown N-layer at approximately 1200° C. Finally, gold-antimony and aluminium contacts are alloyed to the silicon wafer at approximately 700° C.

Thyristors manufactured according to the invention have at least 30% higher reverse and forward blocking voltages for a given thickness at the middle zone than conventional thyristors. This fact can be used so that with maintained forward characteristics, a thyristor with higher reverse blocking characteristics, for example 1300 v. instead of 1000 v. can be achieved or so that for a given reverse and forward blocking voltage a narrower centre zone can be chosen. In this case a lower forward voltage drop and a shorter switching time is then obtained.

I claim:

1. Rectifying semi-conductor body of silicon having a middle zone and one first and one second end zone, said first and said second end zones being of mutually opposite conductivity types and having an impurity concentration of $10^{18}$–$10^{20}$ impurity atoms/cm.$^3$, the middle zone having a lower impurity concentration than said end zones, said first end zone being arranged on one side of the middle zone and forming a first P-N-junction with the middle zone, said second end zone being arranged on the opposite side of said one side of the middle zone and forming a second P-N-junction with the middle zone, said first and said second P-N-junctions being substantially parallel, said middle zone comprising a central layer having one side substantially parallel to said first P-N-junction and a second side substantially parallel to said second P-N-junction, a first outer layer positioned between said first side of the central layer and said first P-N-junction and a second outer layer positioned between said second side of the central layer and said second P-N-junction, said central layer having a thickness of between approximately 100 and 1000 $\mu$m. and a product of impurity concentration and thickness of less than $10^{12}$ impurity atoms/cm.$^2$ and each of said first and said second outer layers having higher conductivity than said central layer and having a thickness of 1–20 percent of the thickness of the central layer and a product of impurity concentration and thickness of $2 \cdot 10^{11}$–$2 \cdot 10^{12}$ impurity atoms/cm.$^2$, said first and said second outer layers being of the same conductivity type and the middle zone comprising an additional layer of a conductivity type opposite to that of said first and second outer layers and arranged between said first outer layer and said first P-N-junction, said additional layer having a thickness of 1–100$\mu$ and a product of impurity concentration and thickness of $10^{12}$–$10^{15}$ impurity atoms/cm.$^2$.

2. Rectifying semi-conductor body as claimed in claim 1 in which the product of impurity concentration and thickness for each of said first and said second outer layers is $5 \cdot 10^{11}$–$10^{12}$ impurity atoms/cm.$^2$.

3. Rectifying semi-conductor body as claimed in claim 1, in which said first end zone is of N-conductivity type, said second end zone of P-conductivity type, said first and said second outer layers of N-conductivity type and said additional layer of P-conductivity type.

4. Rectifying semi-conductor body as claimed in claim 3, in which the central layer is of N-conductivity type.

5. Rectifying semi-conductor body as claimed in claim 1, in which said first end zone is of P-conductivity type, said second end zone of N-conductivity type, said first and said second outer layers of P-conductivity type and said additional layer of N-conductivity type.

6. Rectifying semi-conductor body as claimed in claim 5, in which the central layer is of N-conductivity type.

7. Rectifying semi-conductor body as claimed in claim 5, in which the central layer is of P-conductivity type.

References Cited

UNITED STATES PATENTS

| | | | |
|---|---|---|---|
| 2,983,854 | 5/1961 | Pearson | 317—235 |
| 3,200,259 | 8/1965 | Braunstein | 307—88.5 |
| 3,277,352 | 10/1966 | Hubner | 317—234 |
| 3,284,639 | 11/1966 | Giuliana et al. | 307—88.5 |

FOREIGN PATENTS

| | | |
|---|---|---|
| 1,263,548 | 5/1961 | France. |

L. DEWAYNE RUTLEDGE, Primary Examiner

P. WEINSTEIN, Assistant Examiner

U.S. Cl. X.R.

148—33; 317—234, 235